United States Patent [19]
Fong et al.

[11] Patent Number: 5,416,369
[45] Date of Patent: May 16, 1995

[54] HIGH-SENSITIVITY HIGH-RESOLUTION COMPARATOR

[75] Inventors: Edison Fong, Sunnyvale; Bill C. Wong, Milpitas, both of Calif.

[73] Assignee: National Semiconductor Corporation, Santa Clara, Calif.

[21] Appl. No.: 115,886

[22] Filed: Sep. 1, 1993

[51] Int. Cl.$^6$ .............................. H03K 5/24
[52] U.S. Cl. ........................ 327/65; 327/63; 327/89
[58] Field of Search .......... 307/494, 542.1, 543, 307/272.3, 573, 289, 530, 602, 362, 355, 279, 350, 542; 328/55

[56] References Cited

U.S. PATENT DOCUMENTS

| | | | |
|---|---|---|---|
| 4,045,686 | 8/1977 | Masuda | 327/63 |
| 4,110,641 | 8/1978 | Payne | 327/63 |
| 4,237,387 | 12/1980 | Denendorf et al. | 307/289 |
| 4,476,401 | 10/1984 | Lin | 328/55 |
| 4,549,100 | 10/1985 | Spence | 327/77 |
| 4,736,117 | 4/1988 | Wieser | 302/494 |
| 4,972,517 | 11/1990 | Kondou et al. | 307/494 |
| 5,231,319 | 7/1993 | Crafts et al. | 307/602 |
| 5,274,275 | 12/1993 | Colles | 302/494 |

OTHER PUBLICATIONS

Benevit, et al., A 256K Dynamic Random Access Memory, dated Oct. 1982, IEEE Journal of Solid State Circuits, vol. SC-17, No. 5, pp. 857-861.
Kung, et al., An 8K×8 Dynamic RAM with Self-Refresh, dated Oct. 1982, IEEE Journal of Solid State Circuits, vol. SC-17, No. 5, pp. 863-867.
Fujii, et al., A 90 ns 256 K×1 Bit DRAM with Double-Level Al Technology, dated Oct. 1983, IEEE Journal of Solid State Circuits, vol. SC-18, No. 5, pp. 437-440.
D. Shear, "Analog Comparators," *EDN*, vol. 33, No. 1 (Jan. 1988), pp. 75-82.

Primary Examiner—Timothy P. Callahan
Assistant Examiner—Dinh Le
Attorney, Agent, or Firm—Limbach & Limbach; H. Donald Nelson; Stephen R. Robinson

[57] ABSTRACT

The comparison circuitry of a comparator is isolated from noise on the power supply and ground by utilizing transistors operating in the forward-active region to isolate the comparison circuitry. The comparison circuitry is further isolated from random noise spikes by utilizing delay and switching circuitry to control the duration of the comparison.

11 Claims, 2 Drawing Sheets

HIGH-SENSITIVITY HIGH-RESOLUTION COMPARATOR

BACKGROUND OF THE INVENTION

1. Field of the Invention

The present invention relates to high-resolution comparators and, in particular, to a comparator that improves sensitivity by reducing the effect of power supply, ground and randomly occurring noise.

2. Description of the Related Art

An analog-to-digital (A/D) converter is a device that converts the instantaneous value of a voltage signal into an equivalent digital representation. Typically, the A/D converter utilizes a comparator to compare the instantaneous value to a series of reference voltages to determine which of the reference voltages is greater than the instantaneous value.

Recently, with the movement towards increased computing ability and reduced power, there is a need for 16-bit A/D convertors which can operate on 4.5 volts, using a 4 volt reference. One problem with resolving 16-bits in a 4 volt full scale A/D converter, however, has been that with 16-bits, each bit transition is equivalent to only 60 uV. Therefore, to achieve a ½ least significant bit (LSB) accuracy, a sensitivity of 30 uV must be achieved.

Sensing these minute voltages not only requires a very sensitive comparator, but also requires a comparator with extremely high noise immunity to both the power supply and ground as well as from randomly occurring sources of noise. Thus, there is a need for a high-resolution comparator that has extremely high noise immunity.

SUMMARY OF THE INVENTION

The present invention provides a high resolution comparator that achieves a sensitivity of approximately 15-20 uV by utilizing high impedance devices to isolate comparison circuitry from noise on the power supply and ground, by optimizing the gain of the comparison circuitry, and by utilizing delay and switching circuitry to control the duration of the comparison, known as a comparison window, thereby reducing the effect of random noise spikes.

In accordance with the present invention, the high-resolution voltage comparator includes a differential stage that amplifies the difference between the voltages of a pair of differential input signals to produce a corresponding pair of output voltages at a pair of output nodes. A first isolation stage, which is connected to a power supply and the differential stage, isolates the differential stage from noise on the power supply. A first control stage, which is connected to the differential stage, controls the operation of the differential stage in response to an externally-generated timing signal. A second isolation stage, which is connected to ground and the first switching stage, isolates the switching stage, and thereby the differential stage, from noise on ground. A second control stage controls a comparison window by further controlling the operation of the differential stage.

The differential stage can include, for example, a differential pair stage and a latch stage. The differential pair stage sinks a comparison current, sources a first output current into a first node of the pair of nodes, and provides a second output current into a second node of the pair of nodes in response to the voltages at the pair of nodes and the voltage between the differential pair stage and the first isolation stage. In addition, the first output current and the second output current each have a magnitude which is defined by the relative magnitudes of the voltages of the pair of differential input signals.

The latch stage sources a latched current in response to sinking the first output current and the second output current, and changes the voltage at the first node and the voltage at the second node in response to changes in the magnitudes of the first output current and the second output current.

The first isolation stage can include, for example, a first transistor that sources the comparison current and that isolates the differential pair stage from noise on the power supply when the first transistor enters the forward-active region of operation.

The first control stage controls the operation of the differential stage by stopping the latched current when the timing signal is de-asserted, by sinking the latched current as a small current after the timing signal is asserted, and by sinking a large current a first delay time after the timing signal has been asserted. As a result, when the latched current is stopped, the voltages at the pair of nodes are driven high, thereby driving the comparator into an inactive state.

The first control stage can include a second transistor that sinks the small current to produce an intermediate small current, a third transistor that sinks the large current to produce an intermediate large current, and timing means for turning on the third transistor the first delay time after turning on the second transistor. The timing means may be implemented by, for example, a resistor connected between the second transistor and the third transistor, along with the gate capacitance of the third transistor.

The second isolation stage can include a fourth transistor that sinks the intermediate small current and a fifth transistor that sinks the intermediate large current. The second isolation stage isolates the first control stage from noise on ground when the fourth transistor and the fifth transistor enter the forward-active region of operation.

The second control stage controls the operation of the differential stage by connecting the pair of nodes a second delay time after the timing signal is de-asserted, and by disconnecting the pair of nodes the second delay time after the timing signal is asserted.

The second control stage can include a delay stage and a switching stage. The delay stage asserts a start comparison signal the second delay time after the timing signal is asserted and de-asserts the start comparison signal the second delay time after the timing signal is de-asserted. The switching stage connects the pair of output nodes when the start comparison signal is de-asserted and disconnects the pair of output nodes when the start comparison signal is asserted.

The switching stage can include, for example, a P-channel transistor and an N-channel transistor where the sources of both transistors are connected to the first node, the drains are connected to the second node, and the gates are connected to a first and a second start comparison signal, respectively.

The delay stage may include, for example, a series of serially-connected inverters and a pair of delay transistors which are connected in parallel with a last inverter of the serially-connected inverters. The pair of delay transistors allow the first start comparison signal to be asserted at the same time that the second start comparison signal is asserted by the last inverter.

The second delay time is defined by the total delay of the serially-connected inverters. Thus, by adding or subtracting inverters or similar structures, the timing of the assertion of the first and second start comparison signals can be controlled.

In the present invention, the comparison window is equivalent to the period of the start comparison signals. Since the comparison window begins with the start comparison signals, and since the beginning of the start comparison signals can be controlled, the comparison window can be controlled.

In the present invention, the comparator can further include an amplification stage and a RS flip-flop stage. The amplification stage amplifies the first and second intermediate output voltages to produce amplified first and second intermediate output voltages. The RS flip-flop stage latches the amplified first and second intermediate output voltages to produce a digital output that indicates which of the differential input signals is greater.

A better understanding of the features and advantages of the present invention will be obtained by reference to the following detailed description and the accompanying drawings which set forth an illustrative embodiment in which the principals in the invention are utilized.

DETAILED DESCRIPTION

Figure 1:
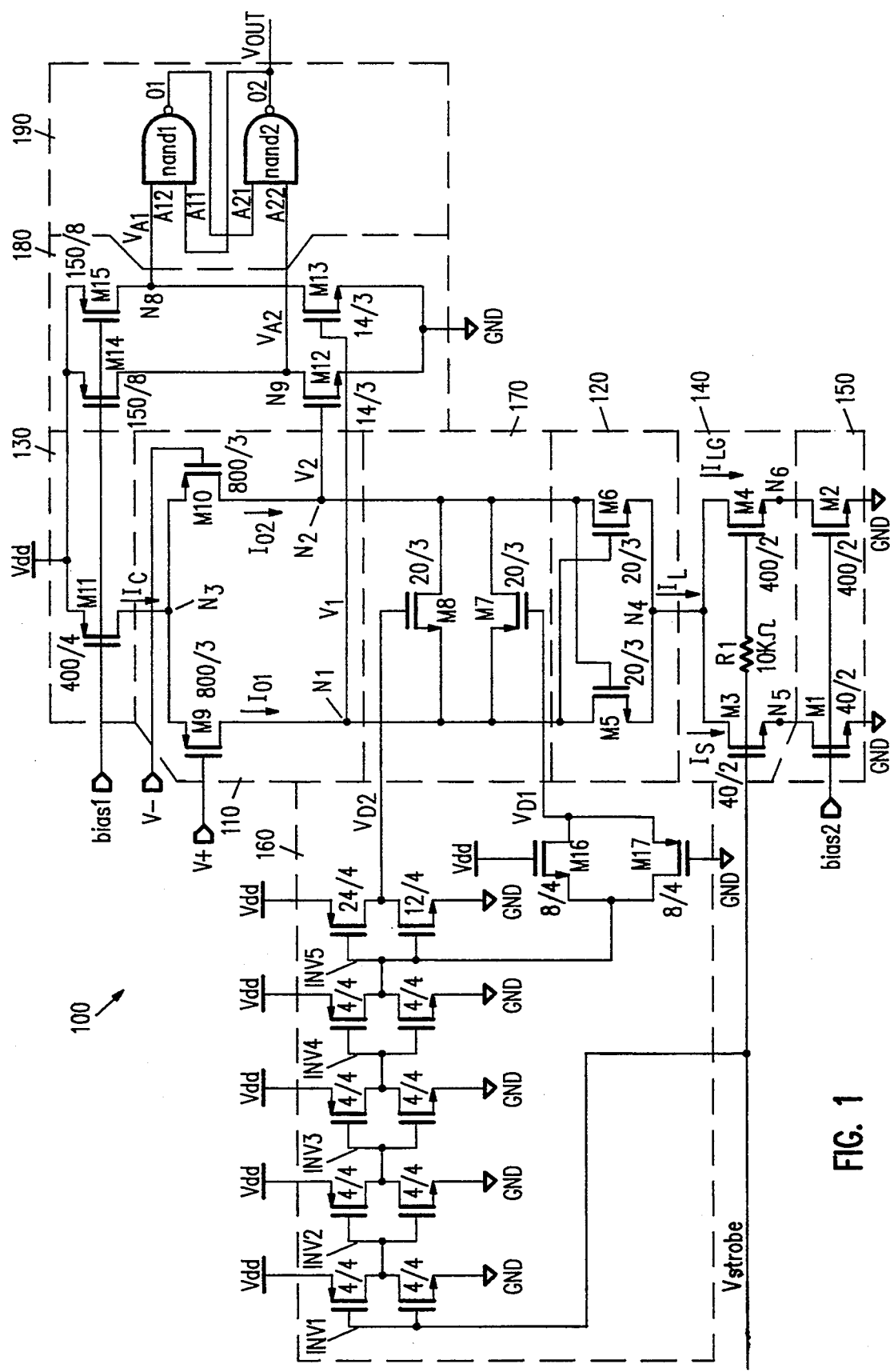
FIG. 1 is a schematic diagram illustrating a comparator 100 in accordance with the present invention.

FIG. 1 shows a schematic diagram that illustrates a high-resolution voltage comparator 100 in accordance with the present invention. As described in greater detail below, comparator 100 improves sensitivity by utilizing high impedance devices to isolate comparison circuitry from noise on the power supply and ground, by optimizing the gain of the comparison circuitry, and by utilizing delay and switching circuitry to control the duration of the comparison, also known as the comparison window, thereby reducing the effect of random noise spikes.

Referring to FIG. 1, comparator 100 includes a differential stage that includes a differential pair stage 110 and a latch stage 120. The differential stage amplifies the difference between the voltages of a pair of differential input signals V+ and V− to produce a corresponding pair of intermediate output voltages $V_1$ and $V_2$ at nodes N1 and N2, respectively.

Differential pair stage 110 includes a pair of P-channel MOS transistors M9 and M10. Transistor M9 has its gate connected to receive the input differential signal V+, its source connected to a node $N_3$, and its drain connected to node $N_1$. Similarly, transistor M10 has its gate connected to receive the input differential signal V−, its source connected to node $N_3$, and its drain connected to a node $N_2$.

As shown in FIG. 1, differential pair stage 110 sinks a comparison current $I_C$, sources a first output current $I_{O1}$ into node $N_1$, and provides a second output current $I_{O2}$ into node $N_2$ in response to the voltages at nodes $N_1$, $N_2$, and $N_3$. As is well-known, the magnitudes of the first and second output currents $I_{O1}$ and $I_{O2}$ are defined by the relative magnitudes of the voltages of the pair of differential input signals V+ and V−.

Latch stage 120 sources a latched current $I_L$ in response to the first and second output currents $I_{O1}$ and $I_{O2}$. As is also well known, latch stage 120 changes the intermediate output voltages $V_1$ and $V_2$, and thus the voltages at nodes $N_1$ and $N_2$, respectively, in response to changes in the magnitudes of the first and second output current $I_{O1}$ and $I_{O2}$.

Latch stage 120 includes a pair of N-channel MOS transistors M5 and M6. Transistor M5 has its gate connected to the drain of transistor M10, its source connected to a node $N_4$, and its drain connected to the drain of transistor M9. Transistor M6 has its gate connected to the drain of transistor M9, its source connected to node $N_4$, and its drain connected to the drain of transistor M10.

Comparator 100 also includes a first isolation stage 130 connected between a power supply Vdd and the differential stage that isolates the differential stage from noise on the power supply Vdd. As shown in FIG. 1, first isolation stage 130 includes a transistor M11 that sources the comparison current $I_C$ and that isolates the differential stage from noise on the power supply Vdd when transistor M11 enters the forward-active region of operation.

Transistor M11 is a P-channel MOS transistor which has its gate connected to a first bias voltage bias1, its source connected to the power supply Vdd, and its drain connected to the sources of both transistors M9 and M10. In the circuit of FIG. 1, the first bias voltage bias1 is set at 3.8 volts.

Comparator 100 further includes a first control stage 140 that controls the operation of the differential stage in response to an externally-generated timing signal $V_{strobe}$. As shown in FIG. 1, first control stage 140 includes a pair of N-channel MOS transistors M3 and M4 and a resistor R1.

Transistor M3 has its gate connected to receive the timing signal $V_{strobe}$, its source connected to a node $N_5$, and its drain connected to the sources of both transistors M5 and M6. Transistor M4 has its gate connected to receive the timing signal $V_{strobe}$ through resistor R1, its source connected to a node $N_6$, and its drain connected to the sources of both transistors M5 and M6. In the FIG. 1 circuit, resistor R1 is 10K ohm.

As shown in FIG. 1, first control stage 140 controls the operation of the differential stage by stopping the latched current $I_L$ when the timing signal $V_{strobe}$ is deasserted, and by sinking the latched current $I_L$ as a small current $I_S$ and a large current $I_{LG}$ when the timing signal $V_{strobe}$ is asserted. By stopping the latched current $I_L$, the voltages at nodes $N_1$, $N_2$, and $N_3$ are driven high. As a result, transistors M9, M10, and M11 are driven into the linear region of operation, thereby driving comparator 100 into an inactive state.

Comparator 100 additionally includes a second isolation stage 150 connected between a ground GND and the first control stage 140 that isolates the first control stage 140, and thereby the differential stage, from noise on ground GND. As shown in FIG. 1, second isolation stage 150 includes a pair of N-channel transistors M1 and M2.

Transistor M1 has its gate connected to a second bias voltage bias2, its source connected to ground GND, and its drain connected to node $N_5$. Transistor M2 has its gate connected to the second bias voltage bias2, its source connected to ground GND, and its drain connected to node $N_6$. In the circuit of FIG. 1, the second bias voltage bias2 is set at 2.0 volts.

Transistors M1 and M2 sink the small current $I_S$ and the large current $I_{LG}$, respectively, and isolate the first control stage 140 from noise on ground GND when the first and second transistors M1 and M2 enter the forward-active region of operation.

The latched current $I_L$ is sunk as a small current $I_S$ and a large current $I_{LG}$ to allow comparator 100 to turn on in two steps, thereby minimizing the possibility that error-producing voltage spikes, which can be produced when a single very large current is turned on, will be generated and erroneously latched.

The relative magnitudes of the small current $I_S$ and the large current $I_{LG}$ are defined by fixing the width-to-length (W/L) ratios of transistors M3/M1 and M4/M2. In the FIG. 1 circuit, the (W/L) ratios of transistors M3 and M1 are set at 40/2 while the W/L ratios of transistors M4 and M2 are set at 400/2.

Comparator 100 additionally includes a second control stage that includes a delay stage 160 and a switching stage 170. The second control stage controls the comparison window which, as stated above, defines the duration of the comparison to reduce the effect of random noise spikes. As described in greater detail below, the second control stage controls the comparison window by also controlling the voltages at nodes $N_1$ and $N_2$.

As shown in FIG. 1, delay stage 160 simultaneously generates a first start comparison signal $V_{D1}$ and a second start comparison signal $V_{D2}$ a first delay time after the timing signal $V_{strobe}$ is asserted. Delay stage 160 includes five inverters INV1-INV5, an N-channel MOS transistor M16, and a P-channel MOS transistor M17.

As is well known in the art, inverters INV1-INV5 can be formed by connecting the gate of a P-channel MOS transistor to the gate of an N-channel MOS transistor to form an input, the drain of the P-channel transistor to the drain of the N-channel transistor to form an output, the source of the P-channel transistor to the power supply Vdd, and the source of the N-channel transistor to ground GND.

As shown in FIG. 1, the input of inverter INV1 is connected to the timing signal $V_{strobe}$, the output of inverter INV5 generates the second start comparison signal $V_{D2}$, and inverters INV2-INV5 have their inputs connected to the outputs of inverters INV1-INV4, respectively.

Transistor M16 has its gate connected to the power supply Vdd, its source connected to the input of inverter INV5, and its drain connected to the gate of transistor M7. Similarly, transistor M17 has its gate connected to ground GND, its drain connected to the input of inverter INV5, and its source connected to the gate of transistor M7.

Transistors M16 and M17 form a delay which matches the delay of inverter INV5 so that the first and the second start comparison signals $V_{D1}$ and $V_{D2}$ turn on and off at the same time. By lay-out matching, the first and the second start comparison signals $V_{D1}$ and $V_{D2}$ can be controlled to turn on and turn off within 50 pS of each other. As described in greater detail below, charge injection, which adds noise to nodes $N_1$ and $N_2$, results when the first and the second start comparison signals $V_{D1}$ and $V_{D2}$ are not turned off precisely at the same time. By utilizing both a P-channel transistor and an N-channel transistor to short nodes $N_1$ and $N_2$, and by turning both transistors on and off at precisely the same time, the sensitivity of comparator 100 is improved as a result of the charge cancellation that is provided by the two transistor arrangement. This, then, reduces the noise that occurs when switching stage 170 disconnects node $N_1$ from node $N_2$.

Switching stage 170 disconnects node $N_1$ from node $N_2$ when the first and second start comparison signals $V_{D1}$ and $V_{D2}$ are asserted, and connects node $N_1$ to node $N_2$ when the first and second start comparison signals $V_{D1}$ and $V_{D2}$ are de-asserted. As a result, as long as timing signal $V_{strobe}$ is de-asserted, nodes $N_1$ and $N_2$ are equivalent, thereby preventing any value from being latched.

Switching stage 170 includes a P-channel MOS transistor M7 and an N-channel MOS transistor M8. Transistor M7 has its gate connected to receive the first start comparison signal $V_{D1}$, its source connected to the drain of transistor M9, and its drain connected to the drain of transistor M10. Similarly, transistor M8 has its gate connected to receive the second start comparison signal $V_{D2}$, its source connected to the drain of transistor M9, and its drain connected to the drain of transistor M10.

For applications where less sensitivity is acceptable, a single P-channel or a single N-channel transistor can be utilized in lieu of transistors M7 and M8. Less sensitivity results when a single transistor is utilized because with a single transistor, a small charge is either injected into or withdrawn from nodes $N_1$ and $N_2$, depending on the type of transistor used, when the gate voltage changes to turn off the single transistor. Although small, the charge injected or withdrawn can produce an erroneous reading when sensitivities on the order of 20 uV are being sought. When both an N-channel and a P-channel transistor are simultaneously turned on and off at the same time, the charge injection of the N-channel transistor is substantially cancelled by the charge withdrawal of the P-channel transistor.

Comparator 100 further includes an amplification stage 180 that amplifies the first and second intermediate output voltages $V_1$ and $V_2$ to produce amplified first and second intermediate output voltages $V_{A1}$ and $V_{A2}$. Amplification stage 180 includes two N-channel MOS transistors M12 and M13, and two P-channel transistors M14 and M15.

Transistor M12 has its gate connected to receive the second intermediate output voltage $V_2$, its source connected to ground GND, and its drain connected to a node $N_7$. Transistor M13 has its gate connected to receive the first intermediate output voltage $V_1$, its source connected to ground GND, and its drain connected to a node $N_8$.

Transistor M14 has its gate connected to the first bias voltage bias1, its source connected to the power supply Vdd, and its drain connected to node $N_7$. Similarly, transistor M15 has its gate connected to the first bias voltage bias1, its source connected to the power supply Vdd, and its drain connected to node $N_8$. Transistors M14 and M15 function as current sources for transistors M12 and M13.

Comparator 100 also includes an RS flip-flop stage 190 that latches the amplified first and second intermediate output voltages $V_{A1}$ and $V_{A2}$ to produce a digital output $V_{OUT}$ that indicates which of the differential input signals V+ or V− is greater. RS flip-flop stage 190 includes a pair of NAND gates nand1 and nand2. First NAND gate nand1 has its first input A11 connected to the output O2 of the second NAND gate nand2, its second input A12 connected to node $N_8$, and its output O1 connected to the first input A21 of the second NAND gate nand2. The second NAND gate nand2 has its second input A22 connected to node $N_7$.

Figure 2:
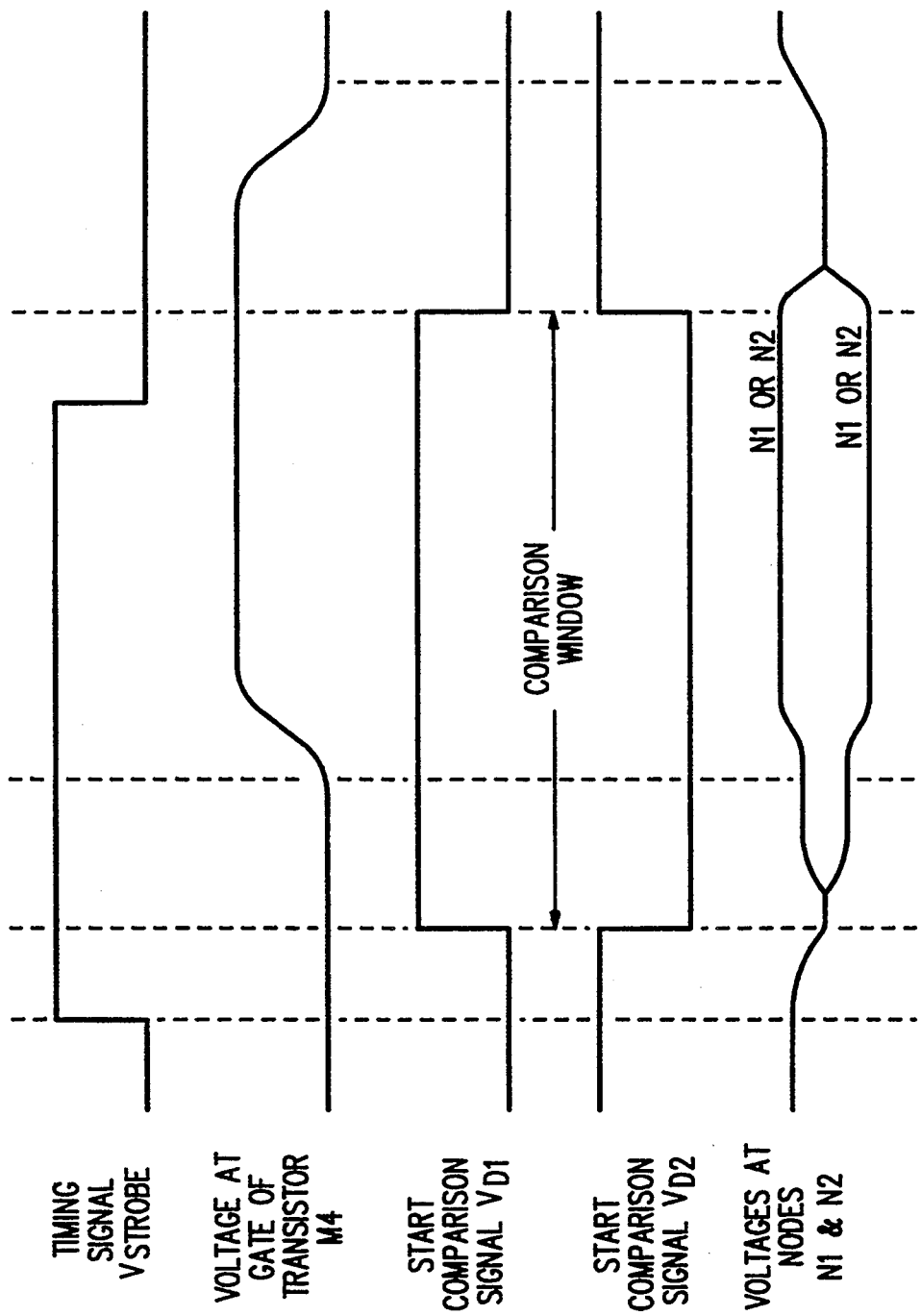
FIG. 2 is a timing diagram illustrating the operation of comparator 100.

FIG. 2 shows a timing diagram illustrating the operation of comparator 100. As shown in FIG. 2, prior to a comparison, the timing signal $V_{strobe}$ is low. As a result, as shown in FIG. 1, the timing signal $V_{strobe}$ turns off transistors M3 and M4, thereby preventing any current from flowing in either leg of differential pair stage 110. Without any current flow, transistors M1, M2, M9, M10 and M11 are driven into the linear region of operation.

In addition, the timing signal $V_{strobe}$ also drives the outputs of inverters INV1, INV3, and INV5 high, thereby driving the first start comparison signal $V_{D1}$ low and the second start comparison signal $V_{D2}$ high. When the first and second start comparison signals $V_{D1}$ and $V_{D2}$ are low and high, respectively, transistors M7 and M8 are both turned on, thereby shorting together both legs of differential stage 110. As a result, the first and second intermediate output voltages $V_1$ and $V_2$, which are identical due to transistors M7 and M8 being turned on, sit slightly below the power supply Vdd when the timing signal $V_{strobe}$ is low.

Referring again to FIG. 2, comparator 100 initially sets up each comparison in response to the leading edge of the timing signal $V_{strobe}$. When the timing signal $V_{strobe}$ transitions high, transistor M3 turns on and begins conducting the small current $I_S$. Transistor M1, which is biased by the first biasing voltage $V_{bias1}$ to operate in the forward-active region when transistor M3 turns on, then begins sinking the small current $I_S$.

As transistor M3 turns on and transistors M3 and M1 begin conducting the small current $I_S$, the voltage at node $N_4$, which is high as a result of the high voltages at nodes $N_1$ and $N_2$, is pulled down. This, in turn, as shown in FIG. 2, begins pulling the voltages at nodes $N_1$ and $N_2$ down. The voltages at nodes $N_1$ and $N_2$ are pulled down by the same amount since both transistors M7 and M8 remain on at this time.

As the voltages at nodes $N_1$ and $N_2$ are pulled down, transistors M9, M10, and M11 are driven into the forward-active region of operation, thereby optimizing the gain of the first and second intermediate output voltages $V_1$ and $V_2$ at nodes $N_1$ and $N_2$, respectively.

Comparator 100 begins each comparison with the leading edges of the start comparison signals $V_{D1}$ and $V_{D2}$ which, after five inverter delays of the timing signal $V_{strobe}$, are simultaneously asserted and de-asserted, respectively. With the leading edges of the start comparison signals $V_{D1}$ and $V_{D2}$, transistors M7 and M8 turn off and the comparison window begins. As a result, as shown in FIG. 2, the first and second intermediate output voltages $V_1$ and $V_2$ at nodes $N_1$ and $N_2$ begin to differ in response to the difference between the pair of differential input signals V+ and V−.

Latch stage 120 amplifies the difference between the pair of differential input signals V+ and V− by the positive feedback operation of latch stage 120. For example, when the voltage of the first differential input signal V+ increases and the second differential input signal V− correspondingly decreases, the voltage at the gate of transistor M6 increases, thereby lowering the voltage at node $N_2$. At the same time, the voltage at the gate of transistor M5 decreases, thereby increasing the voltage at node $N_1$.

Referring again to FIG. 2, after a second time delay, which is determined by the gate capacitance of transistor M4 and the value of resistor R1, the voltage at the gate of transistor M4 increases and transistor M4 turns on and sinks the large current $I_{LG}$. Since transistors M4 and M2 are ten times larger than transistors M3 and M1, the voltage difference between the first and second intermediate output voltages $V_1$ and $V_2$ at nodes $N_1$ and $N_2$, respectively, will increase due to the positive feedback latch formed by transistors M5 and M6. In the FIG. 1 circuit, when transistors M4 and M2 begin sinking the large current $I_{LG}$, the difference between the first and second intermediate output voltages $V_1$ and $V_2$ increases to approximately three volts.

In the present invention, since transistors M1, M2, and M11 are operating in the forward-active region as current sinks (M1, M2) and a source (M11) and since current sinks and sources ideally have virtually infinite impedances, transistors M1, M2 and M11 isolate the first and the second intermediate output voltages $V_1$ and $V_2$ at nodes $N_1$ and $N_2$, respectively, from noise on ground GND and the power supply Vdd, respectively. Further, since transistors M9 and M10 are also operating in the forward-active region of operation, the differential stage optimizes the gain at nodes $N_1$ and $N_2$.

The first and second intermediate output voltages $V_1$ and $V_2$ are then amplified by transistors M12 and M13 and latched by RS flip-flop stage 190. With the falling edge of the timing signal $V_{strobe}$, the transistors in comparator 100 fall back into the linear region of operation and the noise immunity of comparator 100 disappears. This occurs, however, only after the data has been latched by RS flip-flop stage 190. The comparison then ends with the falling edges of the start comparison signals $V_{D1}$ and $V_{D2}$.

Thus, comparator 100 improves sensitivity by utilizing the high impedance state of transistors M1, M2 and M11, acting as current sinks and a source, to isolate the differential stage from the power supply Vdd and ground GND, by insuring that transistors M9 and M10 operate within the forward-active region of operation, thereby optimizing the gain, and by utilizing the delay stage 160 and the switch stage 170 to control the comparison window, thereby reducing the effect of random noise spikes.

It should be understood that various alternatives to the embodiments of the invention described herein and maybe employed in practicing the invention. It is intended that the following claims define the scope of the invention, that methods and apparatus within the scope of these claims be covered thereby.

What is claimed is:

1. A high-resolution voltage comparator comprising:

a differential stage that compares the voltages of a pair of input signals when the differential stage is enabled, and that generates a corresponding pair of output voltages at a pair of output nodes when the pair of output nodes are enabled which indicate which voltage of the pair of input signals is larger and which voltage of the pair of input signals is smaller;

a first isolation stage connected to a power supply and the differential stage that isolates the differential stage from noise on the power supply;

a first control stage connected to the differential stage that enables the differential stage in response to an externally-generated timing signal;

a second isolation stage connected to ground and the first control stage that isolates the first control stage, and thereby the differential stage, from noise on ground; and a second control stage connected to the differential stage that enables the pair of output nodes in response to the timing signal, the second control stage enabling the pair of output nodes a first predetermined delay time after the first control stage enables the differential stage.

2. The comparator of claim 1 wherein the differential stage includes:

a differential pair stage that sinks a comparison current from a comparison node, that sources a first output current into a first output node of the pair of output nodes, and that sources a second output current into a second output node of the pair of output nodes in response to the voltages of the pair of input signals, the first output current and the second output current each having a magnitude which is defined by the relative magnitudes of the voltages of the pair of input signals; and a latch stage connected to the differential pair stage that sources a latched current in response to sinking the first output current and the second output current, and that changes the voltage at the first node and the voltage at the second node in response to changes in the magnitudes of the first output current and the second output current.

3. The comparator of claim 2 wherein the first isolation stage includes a first transistor having a source connected to a power supply, a drain connected to the comparison node, and a gate connected to a first bias voltage, the first transistor sourcing the comparison current and isolating the differential pair stage from noise on the power supply when the first transistor enters the forward-active region of operation.

4. The comparator of claim 1 wherein the first control stage enables the differential stage by sinking a latched current when the timing signal is asserted, and disables the differential stage by stopping the latched current when the timing signal is de-asserted, the first control stage sinking the latched current by sinking a first portion of the latched current when the timing signal is asserted and by sinking the remainder of the latched current a second predetermined delay time after the timing signal is asserted, whereby when the latched current is stopped, the voltages at the pair of output nodes are driven high, thereby driving the comparator into an inactive state.

5. The comparator of claim 4 wherein the first control stage includes:

a second transistor that sinks the first portion of the latched current when the timing signal is asserted to produce an intermediate small current;

a third transistor that sinks the remainder of the latched current when a delayed timing signal is asserted to produce an intermediate large current; and timing means for receiving the timing signal and for outputting the delayed timing signal the second predetermined delay time after receiving the timing signal.

6. The comparator of claim 5 wherein the timing means includes a resistor.

7. The comparator of claim 5 wherein the second isolation stage includes:

a fourth transistor that sinks the intermediate small current in response to a second bias voltage; and a fifth transistor that sinks the intermediate large current in response to the second bias voltage, whereby the second isolation stage isolates the first control stage from noise on ground when the fourth transistor and the fifth transistor enter the forward-active region of operation.

8. The comparator of claim 1 wherein the second control stage disables the pair of output nodes by electrically connecting the pair of output nodes together, and enables the pair of output node by electrically disconnecting the pair of output nodes.

9. The comparator of claim 8 wherein the second control stage comprises:

a delay stage that asserts a start comparison signal the first predetermined delay time after the timing signal is asserted and that de-asserts the start comparison signal the first predetermined delay time after the timing signal is de-asserted; and a switching stage that connects the pair of output nodes when the start comparison signal is de-asserted and that disconnects the pair of output nodes when the start comparison signal is asserted.

10. The comparator of claim 9 wherein the delay stage includes:

a series of serially-connected inverters; and a pair of delay transistors connected together and to the next to last inverter of the serially-connected inverters.

11. The comparator of claim 1 and further comprising:

an amplification stage that amplifies the pair of output voltages to produce a pair of intermediate output voltages; and a RS flip-flop stage that latches the pair of intermediate output voltages to produce a digital output that indicates which of the input signals is greater.

* * * * *